US011864320B2

(12) United States Patent
Liao

(10) Patent No.: US 11,864,320 B2
(45) Date of Patent: Jan. 2, 2024

(54) IMAGE DISPLAY AND COMBINED-TYPE CIRCUIT CARRYING AND CONTROLLING MODULE THEREOF

(71) Applicant: ASTI GLOBAL INC., TAIWAN, Taichung (TW)

(72) Inventor: Chien-Shou Liao, New Taipei (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 408 days.

(21) Appl. No.: 17/317,903

(22) Filed: May 12, 2021

(65) Prior Publication Data
US 2021/0360792 A1  Nov. 18, 2021

(30) Foreign Application Priority Data
May 12, 2020  (TW) ................................. 109115738

(51) Int. Cl.
*H05K 1/18*  (2006.01)
*G09G 3/20*  (2006.01)

(52) U.S. Cl.
CPC ............. *H05K 1/181* (2013.01); *G09G 3/20* (2013.01); *G09G 2300/0426* (2013.01); *H05K 2201/10128* (2013.01)

(58) Field of Classification Search
None
See application file for complete search history.

(56) References Cited

U.S. PATENT DOCUMENTS

| 11,075,330 | B2* | 7/2021 | Li | .......................... H01L 33/60 |
| 11,483,935 | B2* | 10/2022 | Jung | .................... H05K 1/0274 |
| 2013/0334703 | A1* | 12/2013 | Hondo | .................. H01L 23/145 |
| | | | | 257/774 |

(Continued)

FOREIGN PATENT DOCUMENTS

| CN | 106340513 | 1/2017 |
| CN | 106896599 | 6/2017 |

(Continued)

OTHER PUBLICATIONS

"Office Action of China Counterpart Application", dated Jul. 22, 2022, p. 1-p. 6.

*Primary Examiner* — Fred Tzeng
(74) *Attorney, Agent, or Firm* — JCIPRNET

(57) ABSTRACT

An image display and a combined-type circuit carrying and controlling module thereof are provided. The combined-type circuit carrying and controlling module includes a first circuit substrate structure, a control substrate structure, a second circuit substrate structure, an insulative connection structure and a conductive connection structure. The first circuit substrate structure includes a first carrier substrate, a first circuit layout layer and a plurality of first conductive penetration bodies. The control substrate structure includes a circuit substrate and a circuit control chip. The second circuit substrate structure includes a second carrier substrate and a second circuit layout layer. The insulative connection structure is connected between the first carrier substrate and the second carrier substrate. The conductive connection structure is electrically connected between the first circuit layout layer and the second circuit layout layer.

20 Claims, 8 Drawing Sheets

(56) References Cited

U.S. PATENT DOCUMENTS

| | | | |
|---|---|---|---|
| 2014/0087556 A1* | 3/2014 | Kobayashi | H01L 23/49822 438/640 |
| 2018/0337196 A1* | 11/2018 | Yang | H01L 27/1266 |
| 2019/0198490 A1* | 6/2019 | Li | H01L 23/3114 |
| 2019/0326207 A1* | 10/2019 | Hu | H01L 23/49833 |
| 2021/0068261 A1* | 3/2021 | Cho | H05K 1/185 |
| 2021/0185822 A1* | 6/2021 | Lee | H05K 1/186 |
| 2021/0195750 A1* | 6/2021 | Lee | H05K 3/465 |
| 2021/0242118 A1* | 8/2021 | Song | H05K 1/181 |
| 2022/0165649 A1* | 5/2022 | Choi | H01L 23/49838 |
| 2022/0183140 A1* | 6/2022 | Uchida | H05K 1/0204 |
| 2022/0322534 A1* | 10/2022 | Hirano | H05K 3/4632 |
| 2022/0338357 A1* | 10/2022 | Kawagoe | H05K 3/4697 |
| 2023/0199940 A1* | 6/2023 | Suda | H05K 1/185 361/761 |

FOREIGN PATENT DOCUMENTS

| | | |
|---|---|---|
| TW | 202016614 | 5/2020 |
| TW | I693449 B | 5/2020 |

\* cited by examiner

IMAGE DISPLAY AND COMBINED-TYPE CIRCUIT CARRYING AND CONTROLLING MODULE THEREOF

CROSS-REFERENCE TO RELATED PATENT APPLICATION

This application claims the benefit of priority to Taiwan Patent Application No. 109115738, filed on May 12, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a display and a circuit carrying and controlling module thereof, and more particularly to an image display and a combined-type circuit carrying and controlling module thereof.

BACKGROUND OF THE DISCLOSURE

In the related art, a flexible printed circuit board is provided with a circuit control chip that partially occupies a width-wise space of an image display.

SUMMARY OF THE DISCLOSURE

In response to the above-referenced technical inadequacy, the present disclosure provides an image display and a combined-type circuit carrying and controlling module thereof.

In one aspect, the present disclosure provides a combined-type circuit carrying and controlling module including a first circuit substrate structure, a control substrate structure, a second circuit substrate structure, an insulative connection structure and a conductive connection structure. The first circuit substrate structure includes a first carrier substrate, a first circuit layout layer disposed on the first carrier substrate, and a plurality of first conductive penetration bodies that electrically connect to the first circuit layout layer and penetrate through the first carrier substrate. The control substrate structure includes a circuit substrate electrically connected to the first conductive penetration bodies and a circuit control chip disposed on the circuit substrate. The second circuit substrate structure includes a second carrier substrate and a second circuit layout layer disposed on the second carrier substrate. The insulative connection structure is connected between the first carrier substrate and the second carrier substrate. The conductive connection structure is electrically connected between the first circuit layout layer and the second circuit layout layer.

In another aspect, the present disclosure provides an image display that includes a combined-type circuit carrying and controlling module and an image display module that is electrically connected to the combined-type circuit carrying and controlling module. The combined-type circuit carrying and controlling module includes a first circuit substrate structure, a control substrate structure, a second circuit substrate structure, an insulative connection structure and a conductive connection structure. The first circuit substrate structure includes a first carrier substrate, a first circuit layout layer disposed on an upper surface of the first carrier substrate, and a plurality of first conductive penetration bodies that electrically connect to the first circuit layout layer and penetrate through the first carrier substrate. The control substrate structure includes a circuit substrate disposed under a lower surface of the first carrier substrate, and a circuit control chip disposed on the circuit substrate. The second circuit substrate structure includes a second carrier substrate and a second circuit layout layer disposed on an upper surface of the second carrier substrate. The insulative connection structure is connected between the first carrier substrate and the second carrier substrate. The conductive connection structure is disposed on the first carrier substrate, the second carrier substrate and the insulative connection structure, and electrically connected between the first circuit layout layer and the second circuit layout layer. The image display module is electrically connected between the first circuit layout layer and the second circuit layout layer.

Therefore, by virtue of "the first circuit substrate structure including a first carrier substrate, a first circuit layout layer disposed on the first carrier substrate, and a plurality of first conductive penetration bodies that electrically connect to the first circuit layout layer and penetrate through the first carrier substrate", "the control substrate structure including a circuit substrate electrically connected to the conductive penetration bodies and a circuit control chip disposed on the circuit substrate", "the second circuit substrate structure including a second carrier substrate and a second circuit layout layer disposed on the second carrier substrate", "the insulative connection structure being connected between the first carrier substrate and the second carrier substrate", and "the conductive connection structure being electrically connected between the first circuit layout layer and the second circuit layout layer", the control substrate structure can be disposed under the first circuit substrate structure, and the control substrate structure can be electrically connected between the first circuit substrate structure and the second circuit substrate structure through the first conductive penetration bodies.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
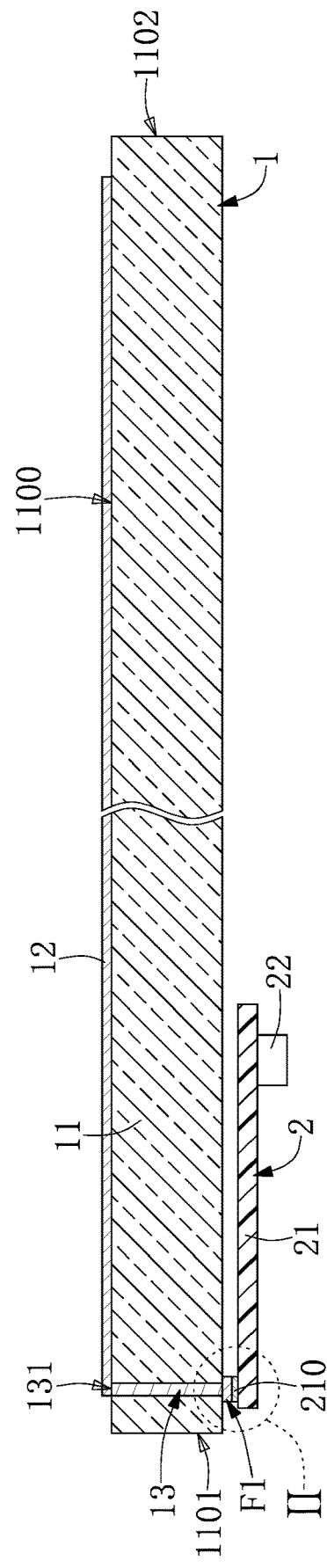
FIG. 1 is a schematic cross-sectional view of a first circuit substrate structure of a combined-type circuit carrying and controlling module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides a combined-type circuit carrying and controlling module M including a first circuit substrate structure 1, a control substrate structure 2, a second circuit substrate structure 3, an insulative connection structure 5 and a conductive connection structure 6.

Figure 2:
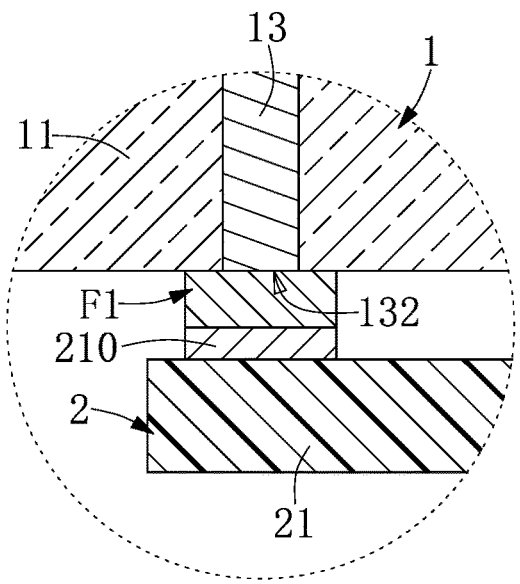
FIG. 2 shows a schematic enlarged view of part II of FIG. 1.
Figure 3:
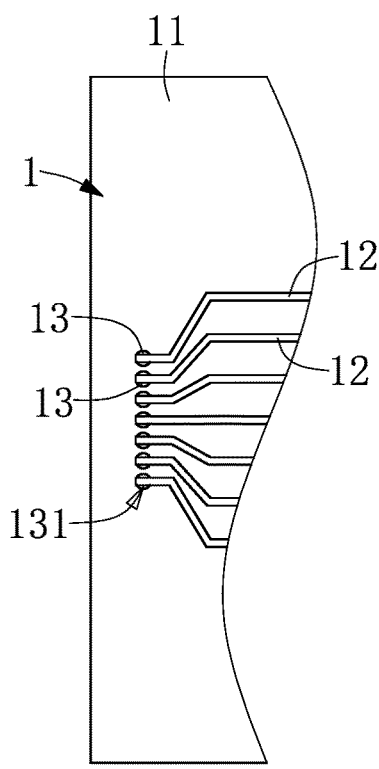
FIG. 3 is a partial schematic top view of the first circuit substrate structure of the combined-type circuit carrying and controlling module according to the first embodiment of the present disclosure.

More particularly, referring to FIG. 1 to FIG. 3, the first circuit substrate structure 1 includes a first carrier substrate 11, a first circuit layout layer 12 disposed on an upper surface of the first carrier substrate 11, and a plurality of first conductive penetration bodies 13 that electrically connect to the first circuit layout layer 12 and penetrate through the first carrier substrate 11. In addition, each of the first conductive penetration bodies 13 includes a first top soldering region 131 and a first bottom soldering region 132 corresponding to the first top soldering region 131, and the first top soldering region 131 and the first bottom soldering region 132 are respectively disposed on two opposite ends of the first conductive penetration body 13. For example, the first carrier substrate 11 may be a silicon substrate, a glass substrate, or any kind of circuit carrier substrate for carrying a circuit layer. However, the aforementioned description is merely an example and is not meant to limit the scope of the present disclosure.

Figure 4:
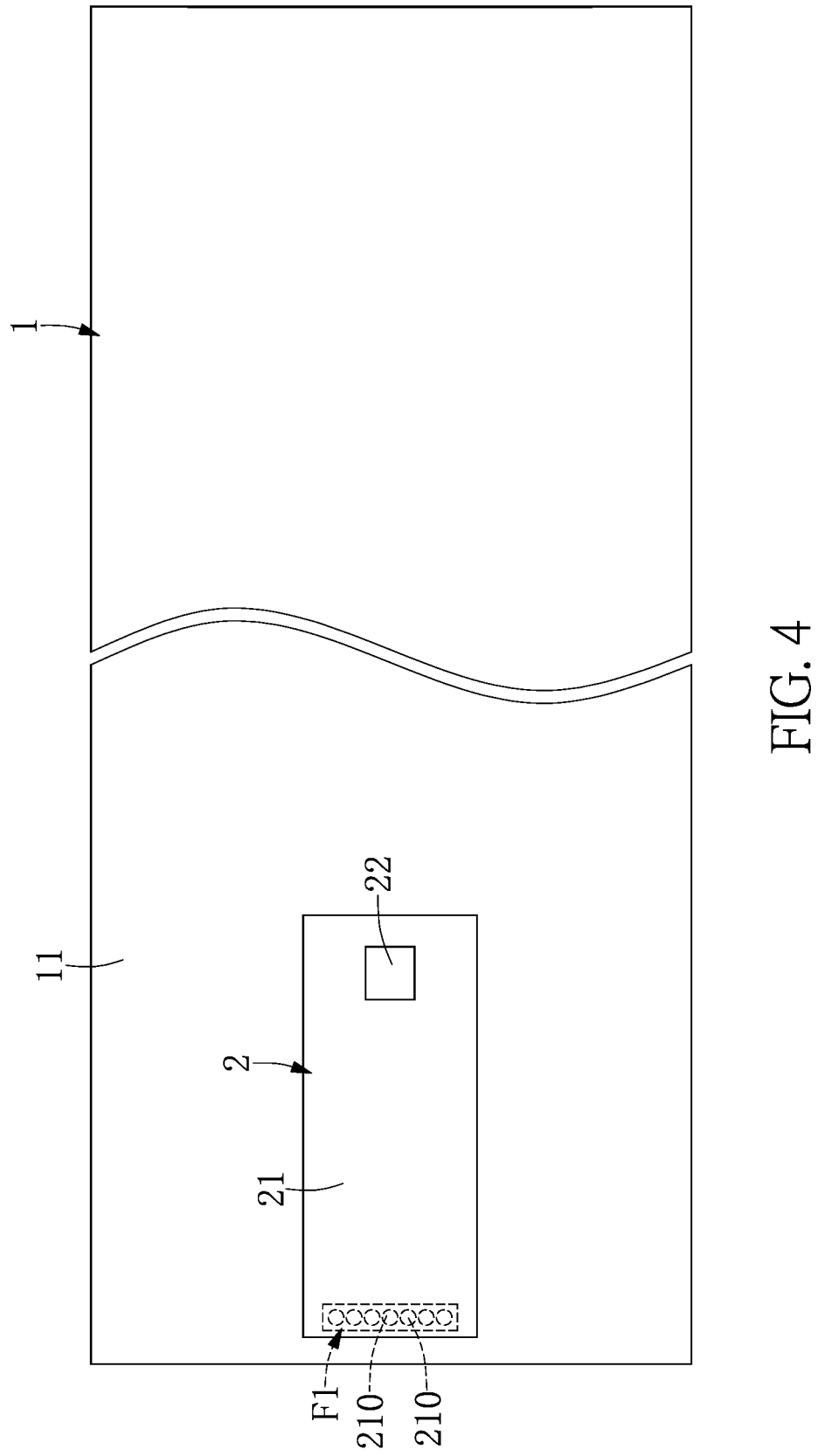
FIG. 4 is a schematic bottom view of the first circuit substrate structure of the combined-type circuit carrying and controlling module according to the first embodiment of the present disclosure.

More particularly, referring to FIG. 1, FIG. 2 and FIG. 4, the control substrate structure 2 includes a circuit substrate 21 disposed under a lower surface of the first carrier substrate 11, and a circuit control chip 22 (or a signal control chip) disposed on the circuit substrate 21, and the circuit control chip 22 is electrically connected to the circuit substrate 21. In addition, the first circuit layout layer 12 and the circuit substrate 21 can respectively electrically connect to the first top soldering region 131 and the first bottom soldering region 132. For example, the circuit substrate 21 may be a rigid circuit board or a flexible circuit board, and the circuit substrate 21 includes a plurality of first conductive contacts 210 that are respectively electrically connected to the first conductive penetration bodies 13. Moreover, the first conductive contacts 210 of the circuit substrate 21 can respectively electrically connect to the first bottom soldering regions 132 of the first conductive penetration bodies 13 through a first anisotropic conduction film F1, and the first anisotropic conduction film F1 can be replaced with anisotropic conduction glue, a cable connector or a plurality of solder balls. However, the aforementioned description is merely an example and is not meant to limit the scope of the present disclosure.

Figure 5:
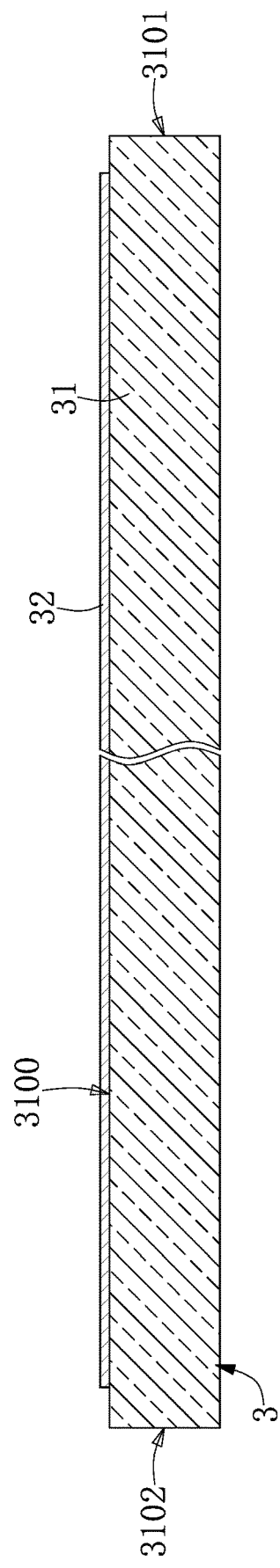
FIG. 5 is a schematic cross-sectional view of a second circuit substrate structure of the combined-type circuit carrying and controlling module according to the first embodiment of the present disclosure.

More particularly, referring to FIG. 5, the second circuit substrate structure 3 includes a second carrier substrate 31 and a second circuit layout layer 32 disposed on an upper surface of the second carrier substrate 31. For example, the second carrier substrate 31 may be a silicon substrate, a glass substrate or any kind of circuit carrier substrate for carrying a circuit layer. However, the aforementioned description is merely an example and is not meant to limit the scope of the present disclosure.

Figure 6:
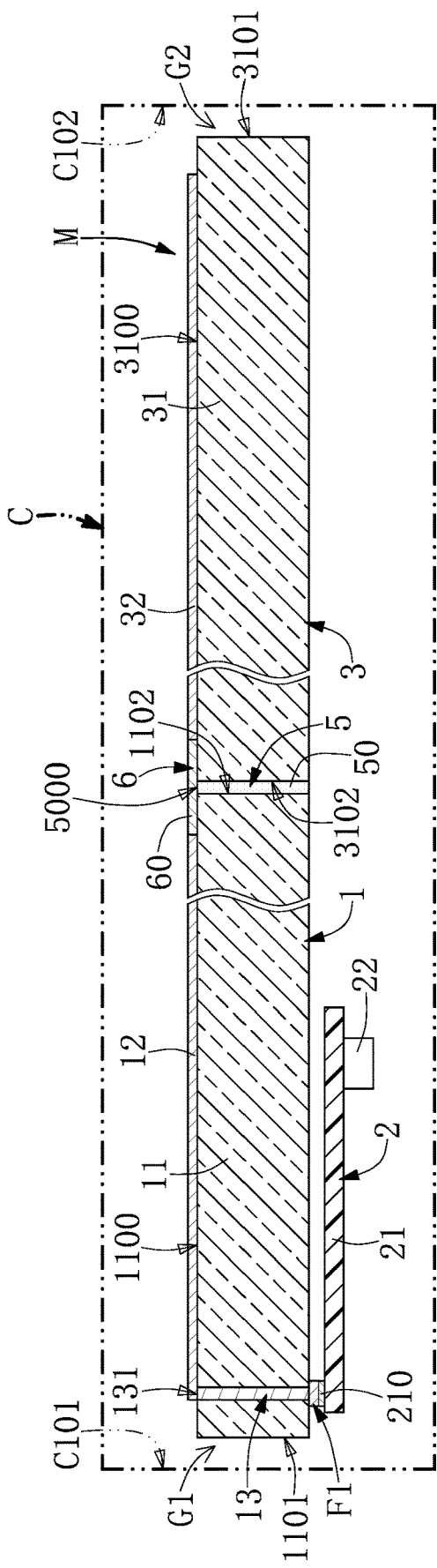
FIG. 6 is a schematic cross-sectional view of the combined-type circuit carrying and controlling module according to the first embodiment of the present disclosure.

It should be noted that, referring to FIG. 1, FIG. 5 and FIG. 6, when the first circuit substrate structure 1 and the control substrate structure 2 are disposed inside a casing C, a first side 1101 of the first carrier substrate 11 can be adjacent to (or proximate to) or in contact with (such as in direct or indirect contact with) a first inner surface C101 of the casing C, so that a first unoccupied gap G1 is formed between the first side 1101 of the first carrier substrate 11 and the first inner surface C101 of the casing C. In addition, when the second circuit substrate structure 3 is disposed inside the casing C, a first side 3101 of the second carrier substrate 31 can be adjacent to (or proximate to) or in contact with (such as in direct or indirect contact with) a second inner surface C102 of the casing C, so that a second unoccupied gap G2 is formed between the first side 3101 of the second carrier substrate 31 and the second inner surface C102 of the casing C. Furthermore, the control substrate structure 2 can be placed under the first circuit substrate structure 1, and the control substrate structure 2 can be electrically connected to the first circuit layout layer 12 of the first circuit substrate structure 1 through the first conductive penetration bodies 13, so that the control substrate structure 2 can be electrically connected to the first circuit layout layer 12 of the first circuit substrate structure 1 without passing through the first unoccupied gap G1. As a result, a distance or a space between the first side 1101 of the first carrier substrate 11 and the first inner surface C101 of the casing C can be effectively reduced, thus allowing for a size (or a width) of the casing C of an electronic product using the combined-type circuit carrying and controlling module M to be effectively reduced.

More particularly, referring to FIG. 1, FIG. 5 and FIG. 6, the insulative connection structure 5 is connected between the first carrier substrate 11 and the second carrier substrate 31, and the conductive connection structure 6 is disposed on the first carrier substrate 11, the second carrier substrate 31 and the insulative connection structure 5, and the conductive connection structure 6 is electrically connected between the first circuit layout layer 12 and the second circuit layout layer 32. For example, the insulative connection structure 5 includes an insulative connection layer 50 that is connected between a second side 1102 of the first carrier substrate 11 and a second side 3102 of the second carrier substrate 31, and an upper surface 1100 of the first carrier substrate 11, an upper surface 3100 of the second carrier substrate 31 and an upper surface 5000 of the insulative connection layer 50 can be flush with each other. In addition, the conductive connection structure 6 includes a conductive connection layer 60 that is electrically connected between the first circuit layout layer 12 and the second circuit layout layer 32, and the conductive connection layer 60 is disposed on the upper surface 1100 of the first carrier substrate 11, the upper surface 3100 of the second carrier substrate 31, and the upper surface 5000 of the insulative connection layer 50. However, the aforementioned description is merely an example and is not meant to limit the scope of the present disclosure.

Second Embodiment

Figure 7:
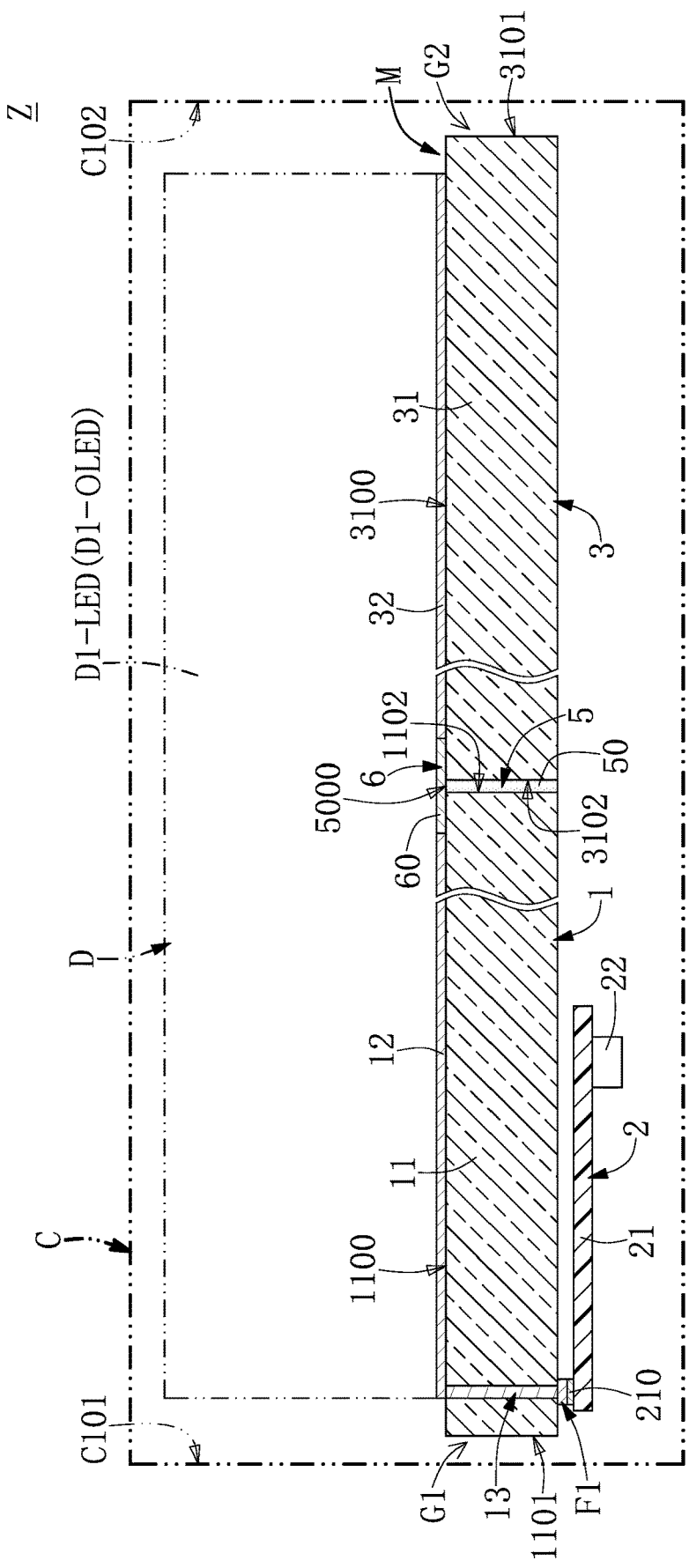
FIG. 7 is a schematic cross-sectional view of an image display according to a second embodiment of the present disclosure.

Referring to FIG. 6 and FIG. 7, a second embodiment of the present disclosure provides an image display Z including a combined-type circuit carrying and controlling module M and an image display module D electrically connected to the combined-type circuit carrying and controlling module M. In addition, the combined-type circuit carrying and controlling module M includes a first circuit substrate structure 1, a control substrate structure 2, a second circuit substrate structure 3, an insulative connection structure 5 and a conductive connection structure 6 (having the same configuration as that in the first embodiment, as shown in FIG. 6), and the image display module D is electrically connected to the first circuit layout layer 12 of the first circuit substrate structure 1 and the second circuit layout layer 32 of the second circuit substrate structure 3. For example, the image display module D includes an LED (light-emitting diode) display module (D1-LED) or an OLED (organic light-emitting diode) display module (D1-OLED) that is disposed above the combined-type circuit carrying and controlling module M. However, the aforementioned description is merely an example and is not meant to limit the scope of the present disclosure.

Therefore, the control substrate structure 2 can be electrically connected to the first circuit layout layer 12 of the first circuit substrate structure 1 without passing through the first unoccupied gap G1, so that the distance or the space between the first side 1101 of the first carrier substrate 11 and the first inner surface C101 of the casing C can be effectively reduced, thus allowing for the size (or the width) of the casing C of the image display Z using the combined-type circuit carrying and controlling module M to be effectively reduced.

Third Embodiment

Figure 8:
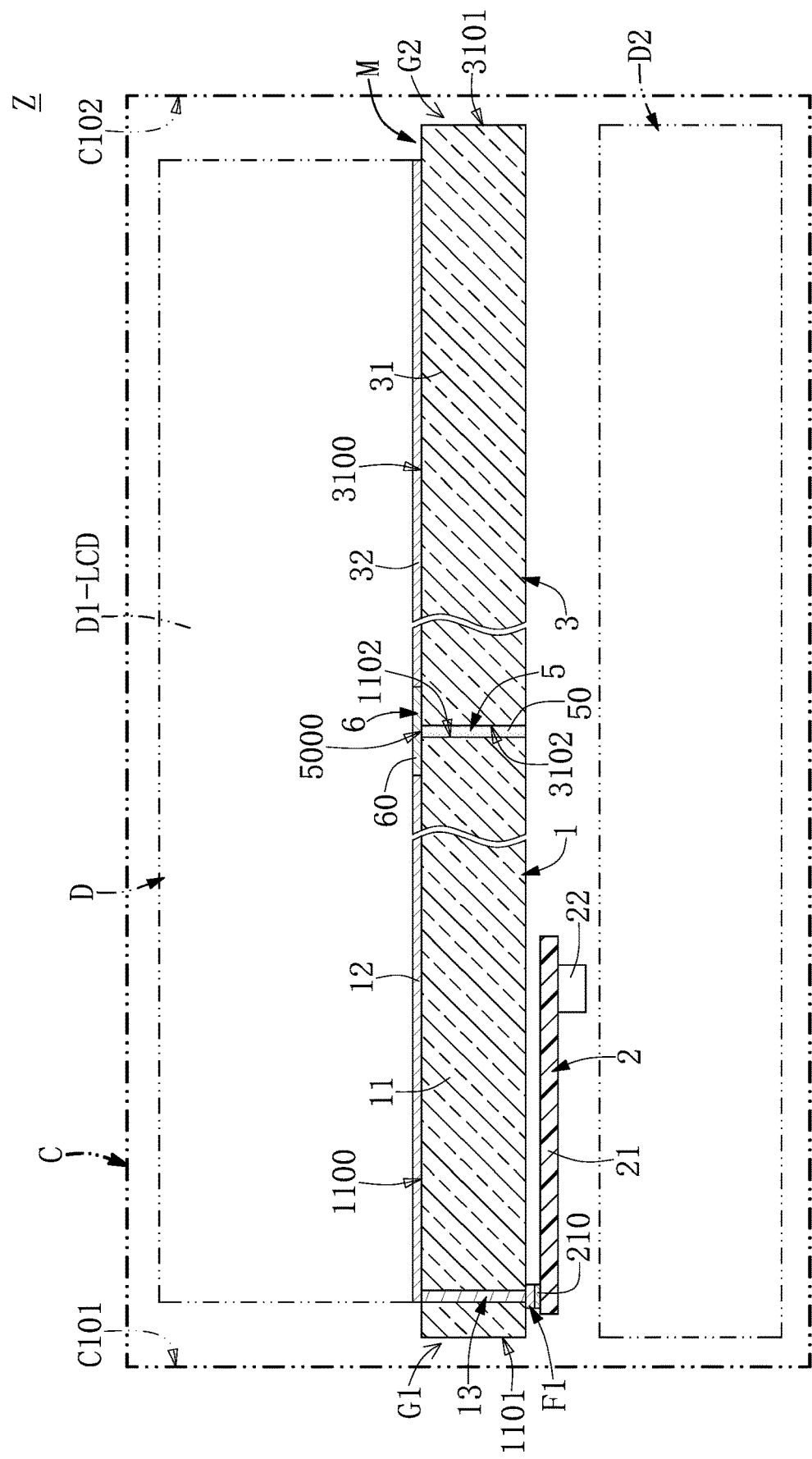
FIG. 8 is a schematic cross-sectional view of an image display according to a third embodiment of the present disclosure.

Referring to FIG. 6 and FIG. 8, a third embodiment of the present disclosure provides an image display Z including a combined-type circuit carrying and controlling module M and an image display module D electrically connected to the combined-type circuit carrying and controlling module M. In addition, the combined-type circuit carrying and controlling module M includes a first circuit substrate structure 1, a control substrate structure 2, a second circuit substrate structure 3, an insulative connection structure 5 and a conductive connection structure 6 (having the same configuration as that in the first embodiment, as shown in FIG. 6), and the image display module D is electrically connected to the first circuit layout layer 12 of the first circuit substrate structure 1 and the second layout layer 32 of the second circuit substrate structure 3. For example, the image display module D includes an LCD (light crystal display) module (D1-LCD) disposed above the combined-type circuit carrying and controlling module M and a back light module D2 disposed under the combined-type circuit carrying and controlling module M. However, the aforementioned description is merely an example and is not meant to limit the scope of the present disclosure.

Figure 9:
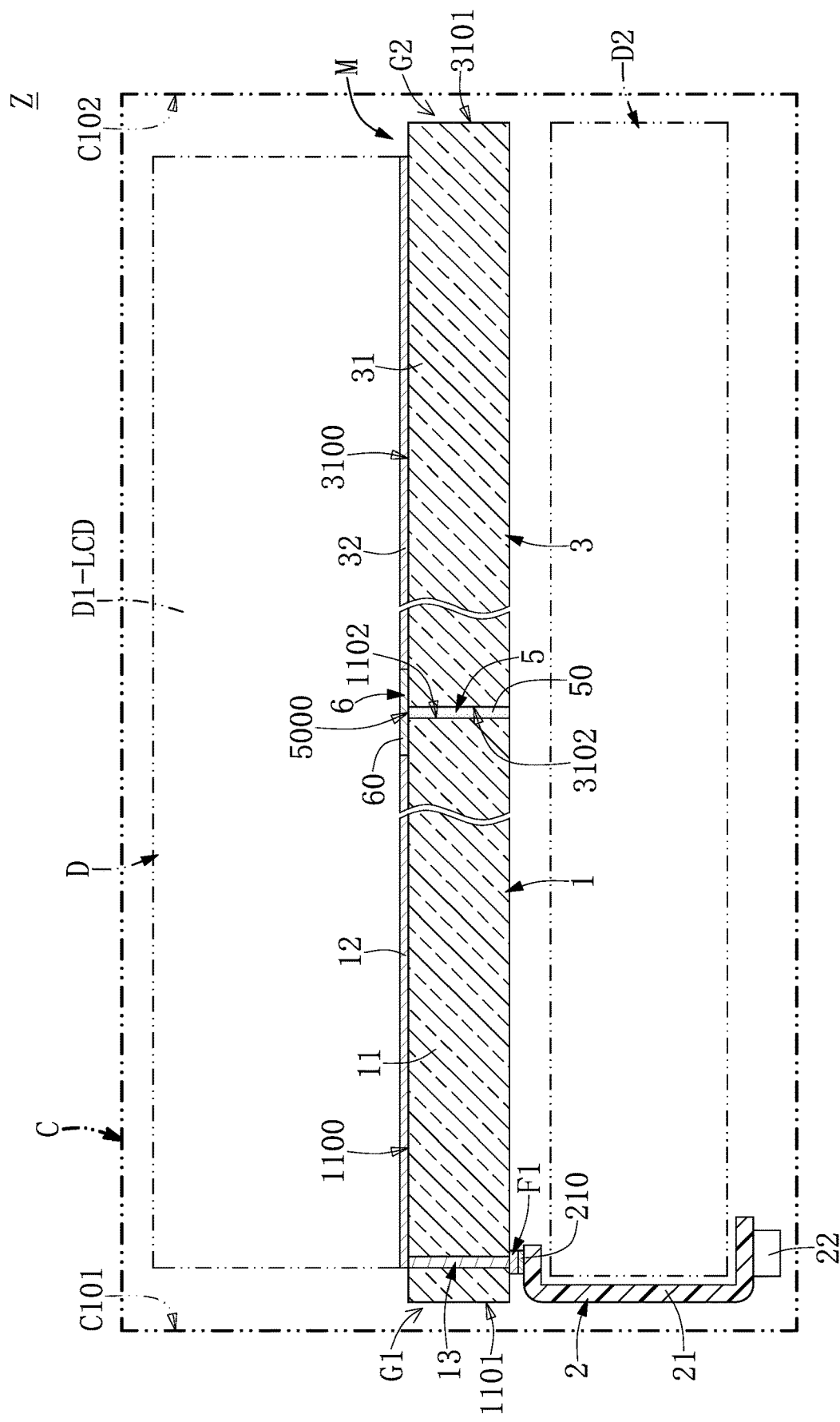
FIG. 9 is a schematic cross-sectional view of another image display according to the third embodiment of the present disclosure.

It should be noted that, as shown in FIG. 9, the control substrate structure 2 can be designed to extend along a side and a bottom surface of the back light module D2 (that is to say, the control substrate structure 2 does not need to be disposed between the circuit substrate structure 1 and the back light module D2), and the circuit control chip 22 of the control substrate structure 2 can be disposed under the back light module D2. However, the aforementioned description is merely an example and is not meant to limit the scope of the present disclosure.

Therefore, the control substrate structure 2 can be electrically connected to the first circuit layout layer 12 of the first circuit substrate structure 1 without passing through the first unoccupied gap G1, so that the distance or the space between the first side 1101 of the first carrier substrate 11 and the first inner surface C101 of the casing C can be effectively reduced, thus allowing for the size (or the width) of the casing C of the image display Z using the combined-type circuit carrying and controlling module M to be effectively reduced.

Advantageous Effects of the Embodiment

In conclusion, by virtue of "the first circuit substrate structure 1 including a first carrier substrate 11, a first circuit layout layer 12 disposed on the first carrier substrate 11, and a plurality of first conductive penetration bodies 13 electrically connected to the first circuit layout layer 12 and penetrating through the first carrier substrate 11", "the control substrate structure 2 including a circuit substrate 21 electrically connected to the conductive penetration bodies 13 and a circuit control chip 22 disposed on the circuit substrate 21", "the second circuit substrate structure 3 including a second carrier substrate 31 and a second circuit layout layer 32 disposed on the second carrier substrate 31", "the insulative connection structure 5 being connected between the first carrier substrate 11 and the second carrier substrate 31" and "the conductive connection structure 6 being electrically connected between the first circuit layout layer 12 and the second circuit layout layer 32", the control substrate structure 2 can be disposed under the first circuit substrate structure 1, and the control substrate structure 2 can be electrically connected between the first circuit substrate structure 1 and the second circuit substrate structure 3 through the first conductive penetration bodies 13.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A combined-type circuit carrying and controlling module, comprising:
    a first circuit substrate structure including a first carrier substrate, a first circuit layout layer disposed on an upper surface of the first carrier substrate, and a plurality of first conductive penetration bodies that electrically connect to the first circuit layout layer and penetrate through the first carrier substrate;
    a control substrate structure including a circuit substrate disposed under a lower surface of the first carrier substrate, and a circuit control chip disposed on the circuit substrate;
    a second circuit substrate structure including a second carrier substrate and a second circuit layout layer disposed on an upper surface of the second carrier substrate;
    an insulative connection structure connected between the first carrier substrate and the second carrier substrate; and
    a conductive connection structure disposed on the first carrier substrate, the second carrier substrate and the insulative connection structure, and electrically connected between the first circuit layout layer and the second circuit layout layer.

2. The combined-type circuit carrying and controlling module according to claim 1, wherein the first circuit substrate structure and the control substrate structure are disposed inside a casing, and a first side of the first carrier substrate is adjacent to or in contact with a first inner surface of the casing, so that a first unoccupied gap is formed between the first side of the first carrier substrate and the first inner surface of the casing; wherein the circuit substrate is a rigid circuit board or a flexible circuit board, and the circuit substrate does not pass through the first unoccupied gap.

3. The combined-type circuit carrying and controlling module according to claim 1, wherein the second circuit substrate structure is disposed inside a casing, and a first side of the second carrier substrate is adjacent to or in contact with a second inner surface of the casing, so that a second unoccupied gap is formed between the first side of the second carrier substrate and the second inner surface of the casing.

4. The combined-type circuit carrying and controlling module according to claim 1, wherein the insulative connection structure includes an insulative connection layer connected between a second side of the first carrier substrate and a second side of the second carrier substrate, and the upper surface of the first carrier substrate, the upper surface of the second carrier substrate and an upper surface of the insulative connection layer are flush with each other.

5. The combined-type circuit carrying and controlling module according to claim 1, wherein each of the first conductive penetration bodies includes a first top soldering region and a first bottom soldering region corresponding to the first top soldering region, and the first circuit layout layer and the circuit substrate are respectively electrically connected to the first top soldering region and the first bottom soldering region.

6. The combined-type circuit carrying and controlling module according to claim 5, wherein the circuit substrate includes a plurality of first conductive contacts respectively electrically connected to the first conductive penetration bodies, and the first conductive contacts of the circuit substrate are respectively electrically connected to the first bottom soldering regions of the first conductive penetration bodies through a first anisotropic conduction film.

7. A combined-type circuit carrying and controlling module, comprising:
    a first circuit substrate structure including a first carrier substrate, a first circuit layout layer disposed on the first carrier substrate, and a plurality of first conductive penetration bodies that electrically connect to the first circuit layout layer and penetrate through the first carrier substrate;
    a control substrate structure including a circuit substrate electrically connected to the first conductive penetration bodies and a circuit control chip disposed on the circuit substrate;
    a second circuit substrate structure including a second carrier substrate and a second circuit layout layer disposed on the second carrier substrate;
    an insulative connection structure connected between the first carrier substrate and the second carrier substrate; and
    a conductive connection structure electrically connected between the first circuit layout layer and the second circuit layout layer.

8. The combined-type circuit carrying and controlling module according to claim 7, wherein the first circuit substrate structure and the control substrate structure are disposed inside a casing, and a first side of the first carrier substrate is adjacent to or in contact with a first inner surface of the casing, so that a first unoccupied gap is formed between the first side of the first carrier substrate and the first inner surface of the casing; wherein the circuit substrate is a rigid circuit board or a flexible circuit board, and the circuit substrate does not pass through the first unoccupied gap.

9. The combined-type circuit carrying and controlling module according to claim 7, wherein the second circuit substrate structure is disposed inside a casing, and a first side of the second carrier substrate is adjacent to or in contact with a second inner surface of the casing, so that a second unoccupied gap is formed between the first side of the second carrier substrate and the second inner surface of the casing.

10. The combined-type circuit carrying and controlling module according to claim 7, wherein the insulative connection structure includes an insulative connection layer connected between a second side of the first carrier substrate and a second side of the second carrier substrate, and an upper surface of the first carrier substrate, an upper surface of the second carrier substrate and an upper surface of the insulative connection layer are flush with each other.

11. The combined-type circuit carrying and controlling module according to claim 7, wherein the conductive connection structure includes a conductive connection layer electrically connected between the first circuit layout layer and the second circuit layout layer, and the conductive connection layer is disposed on the upper surface of the first carrier substrate, the upper surface of the second carrier substrate, and an upper surface of an insulative connection layer.

12. The combined-type circuit carrying and controlling module according to claim 7, wherein each of the first conductive penetration bodies includes a first top soldering region and a first bottom soldering region corresponding to the first top soldering region, and the first circuit layout layer and the circuit substrate are respectively electrically connected to the first top soldering region and the first bottom soldering region.

13. The combined-type circuit carrying and controlling module according to claim 12, wherein the circuit substrate includes a plurality of first conductive contacts respectively electrically connected to the first conductive penetration bodies, and the first conductive contacts of the circuit substrate are respectively electrically connected to the first bottom soldering regions of the first conductive penetration bodies through a first anisotropic conduction film.

14. An image display comprising a combined-type circuit carrying and controlling module and an image display module that is electrically connected to the combined-type circuit carrying and controlling module, wherein the combined-type circuit carrying and controlling module comprises:
   a first circuit substrate structure including a first carrier substrate, a first circuit layout layer disposed on an upper surface of the first carrier substrate, and a plurality of first conductive penetration bodies that electrically connect to the first circuit layout layer and penetrate through the first carrier substrate;
   a control substrate structure including a circuit substrate disposed under a lower surface of the first carrier substrate, and a circuit control chip disposed on the circuit substrate;
   a second circuit substrate structure including a second carrier substrate and a second circuit layout layer disposed on an upper surface of the second carrier substrate;
   an insulative connection structure connected between the first carrier substrate and the second carrier substrate; and
   a conductive connection structure disposed on the first carrier substrate, the second carrier substrate and the insulative connection structure, and electrically connected between the first circuit layout layer and the second circuit layout layer;
   wherein the image display module is electrically connected between the first circuit layout layer and the second circuit layout layer.

15. The image display according to claim 14, wherein the first circuit substrate structure and the control substrate structure are disposed inside a casing, and a first side of the first carrier substrate is adjacent to or in contact with a first inner surface of the casing, so that a first unoccupied gap is formed between the first side of the first carrier substrate and the first inner surface of the casing; wherein the circuit substrate is a rigid circuit board or a flexible circuit board, and the circuit substrate does not pass through the first unoccupied gap.

16. The image display according to claim 14, wherein the second circuit substrate structure is disposed inside the casing, and a first side of the second carrier substrate is adjacent to or in contact with a second inner surface of a casing, so that a second unoccupied gap is formed between the first side of the second carrier substrate and the second inner surface of the casing.

17. The image display according to claim 14, wherein the insulative connection structure includes an insulative connection layer connected between a second side of the first carrier substrate and a second side of the second carrier substrate, and the upper surface of the first carrier substrate, the upper surface of the second carrier substrate and an upper surface of the insulative connection layer are flush with each other.

18. The image display according to claim 14, wherein each of the first conductive penetration bodies includes a first top soldering region and a first bottom soldering region corresponding to the first top soldering region, and the first circuit layout layer and the circuit substrate are respectively electrically connected to the first top soldering region and the first bottom soldering region.

19. The image display according to claim 18, wherein the circuit substrate includes a plurality of first conductive contacts respectively electrically connected to the first conductive penetration bodies, and the first conductive contacts of the circuit substrate are respectively electrically connected to the first bottom soldering regions of the first conductive penetration bodies through a first anisotropic conduction film.

20. The image display according to claim 14, wherein the image display module is disposed above the combined-type circuit carrying and controlling module, and the image display module is a light-emitting diode display module, an organic light-emitting diode display module, or a light crystal display module for cooperating with a back light module that is disposed under the combined-type circuit carrying and controlling module.

* * * * *